(12) United States Patent
Kuhlmann et al.

(10) Patent No.: US 10,739,398 B2
(45) Date of Patent: Aug. 11, 2020

(54) METHOD OF CONSTRUCTING AN ELECTRIC LINEAR DISPLACEMENT MOTOR

(71) Applicant: MTS Systems Corporation, Eden Prairie, MN (US)

(72) Inventors: Tyler B. Kuhlmann, Minnetonka, MN (US); Bradley Dean Schulz, Savage, MN (US); Paul M. Krueger, Maple Grove, MN (US); Don Curtis Petersen, Shakopee, MN (US)

(73) Assignee: MTS Systems Corporation, Eden Prairie, MN (US)

( * ) Notice: Subject to any disclaimer, the term of this patent is extended or adjusted under 35 U.S.C. 154(b) by 271 days.

(21) Appl. No.: 15/791,114

(22) Filed: Oct. 23, 2017

(65) Prior Publication Data
US 2018/0045772 A1    Feb. 15, 2018

Related U.S. Application Data

(62) Division of application No. 13/839,659, filed on Mar. 15, 2013, now Pat. No. 9,797,943.
(Continued)

(51) Int. Cl.
*G01R 31/28* (2006.01)
*H02K 41/03* (2006.01)
(Continued)

(52) U.S. Cl.
CPC ............. *G01R 31/28* (2013.01); *H02K 5/00* (2013.01); *H02K 15/14* (2013.01); *H02K 15/16* (2013.01);
(Continued)

(58) Field of Classification Search
CPC ........ G01R 31/28; H02K 15/14; H02K 15/16; H02K 41/03; H02K 5/00; Y10T 29/49009
See application file for complete search history.

(56) References Cited

U.S. PATENT DOCUMENTS

| 3,149,255 A | 9/1964 | Trench |
| 3,681,629 A | 8/1972 | Drye |

(Continued)

FOREIGN PATENT DOCUMENTS

JP    2009089518 A    4/2009

OTHER PUBLICATIONS

International Search Report and Written Opinion dated Oct. 6, 2014 for corresponding International Application No. PCT/US2013/041832, filed May 20, 2013.

*Primary Examiner* — Minh N Trinh
(74) *Attorney, Agent, or Firm* — Steven M. Koehler; Westman, Champlin & Koehler, P.A.

(57) ABSTRACT

A method of constructing an electric linear displacement motor for use in a testing device includes providing a stator having as stator housing with internal coils and a through bore extending from a first end of the stator housing to the second end of the housing. An armature having magnets retained therein is inserted into the stator housing such of the armature is supported by the first end support and the second end support. A plurality of set screws are inserted into threaded openings proximate both the first end and the second end of the housing. The set screws then support and retain the armature such that there is an annular gap between the armature and the coils.

8 Claims, 11 Drawing Sheets

Related U.S. Application Data

(60) Provisional application No. 61/649,744, filed on May 21, 2012, provisional application No. 61/649,367, filed on May 20, 2012.

(51) Int. Cl.
   *H02K 15/16* (2006.01)
   *H02K 5/00* (2006.01)
   *H02K 15/14* (2006.01)

(52) U.S. Cl.
   CPC ........ H02K 41/03 (2013.01); *Y10T 29/49009* (2015.01)

(56) References Cited

U.S. PATENT DOCUMENTS

| | | |
|---|---|---|
| 4,099,106 A | 7/1978 | Nikaido |
| 4,542,311 A | 9/1985 | Newman |
| 5,019,738 A | 5/1991 | Weilbach |
| 5,434,549 A | 7/1995 | Hirabayashi |
| 5,438,227 A * | 8/1995 | Satomi ............... H02K 41/03 310/12.17 |
| 5,440,183 A * | 8/1995 | Denne ................. F15B 15/00 310/12.26 |
| 5,767,402 A | 6/1998 | Sandlass |
| 5,973,422 A | 10/1999 | Clamme |
| 6,172,436 B1 | 1/2001 | Subler |
| 6,326,706 B1 | 12/2001 | Zhang |
| 6,357,303 B1 * | 3/2002 | Smith .................. A01N 1/02 73/862.68 |
| 6,731,036 B2 | 5/2004 | Ghiotto |
| 9,270,155 B2 * | 2/2016 | Kuhlmann ........... H02K 41/031 |
| 9,455,608 B2 * | 9/2016 | Schulz ................. H02K 41/031 |
| 9,797,943 B2 * | 10/2017 | Kuhlmann ........... G01R 31/28 |
| 2004/0051416 A1 | 3/2004 | Yamada |
| 2006/0028072 A1 | 2/2006 | Iwasa |
| 2008/0185982 A1 * | 8/2008 | Iwasa .................. H02K 33/00 318/135 |
| 2008/0246351 A1 * | 10/2008 | Iwasa .................. H02K 33/00 310/14 |
| 2008/0246352 A1 | 10/2008 | Iwasa |
| 2009/0033157 A1 | 2/2009 | Maemura |
| 2011/0288791 A1 | 11/2011 | Jeppesen |
| 2018/0045772 A1 * | 2/2018 | Kuhlmann ........... G01R 31/28 |

* cited by examiner

METHOD OF CONSTRUCTING AN ELECTRIC LINEAR DISPLACEMENT MOTOR

CROSS-REFERENCE TO RELATED APPLICATION

This application is a divisional of Ser. No. 13/839,659, filed Mar. 15, 2013, entitled "ELECTRIC LINEAR ACTUATOR ASSEMBLY AND METHOD OF ASSEMBLY", which claims the benefit of U.S. Provisional patent application Ser. No. 61/649,744, entitled "LINEAR MOTOR ASSEMBLY" filed May 21, 2012, and U.S. Provisional patent application Ser. No. 61/649,367, entitled "HEAD ASSEMBLY FOR TEST APPARATUS WITH COOLING FEATURES" filed May 20, 2012, the contents of each of which are incorporated herein by reference in their entireties.

BACKGROUND

The discussion below is merely provided for general background information and is not intended to be used as an aid in determining the scope of the claimed subject matter.

Test machines or apparatus are used to test parameters and/or performance of materials, components, consumer products, electronics, materials, as well as medical and other devices (i.e. test specimens). Typically, test machines include one or more actuators to apply input loads and displacement.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the Background.

One aspect of the present disclosure includes a method of constructing an electric linear displacement motor for use in a testing device includes providing a stator having a stator housing with internal coils and a through bore extending from a first end of the stator housing to the second end of the housing. First and second end supports having through bores are connected to the first and second ends of the stator housing. An armature having magnets retained therein is inserted into the stator housing such that a first end of the armature is supported by the first end support and a second end of the armature is supported by the second end support. A plurality of set screws are inserted into threaded openings proximate both the first end and the second end of the housing such that the set screws retain the armature such that there is an annular gap between the armature and the coils and the first and second end supports provide no support to the armature.

Another aspect of the present disclosure includes an electric linear displacement motor for use in a testing apparatus. The electric linear displacement motor comprises a stator having a stator housing having a first end and a second end and a through bore extending from the first end to the second end and a plurality of coils within the stator housing where each of the individual coils in the plurality of coils can be independently energized to create a desired electric field within the stator. The electric linear displacement motor includes an armature assembly having an armature with a first end and a second end and wherein the armature includes a plurality of magnets along a length of the armature. A first end portion coupled to the first end of the armature wherein the first end portion has a first selected length and a second end portion coupled to the second end of the armature wherein the second end portion has a second selected length. The electric linear displacement motor also includes a first bearing assembly attached to the first end of the stator housing. The first bearing assembly comprises a first bearing housing configured to be attached to the first end of the stator housing and a first bearing positioned within the first bearing housing. The first end portion engages and is carried by the first bearing and wherein the armature does not contact the first bearing. The electric linear displacement motor also includes a second bearing assembly attached to the second end of the stator housing. The second bearing assembly comprises a second bearing housing configured to be attached to the second end of the stator housing and a second bearing positioned within the second bearing housing. The second end portion engages and is carried by the second bearing and wherein the armature does not contact the second bearing.

Another aspect of the present disclosure relates to a test device having an electric linear displacement motor, a load cell attached to a component of the electric linear displacement motor and a specimen holder coupled to the load cell. The electric linear displacement motor comprises a stator having a stator housing having a first end and a second end and a through bore extending from the first end to the second end and a plurality of coils within the stator housing where each of the individual coils in the plurality of coils can be independent energized to create a desired electric field within the stator. The electric linear displacement motor includes an armature assembly having an armature with a first end and a second end and wherein the armature includes a plurality of magnets along a length of the armature. A first end portion coupled to the first end of the armature wherein the first end portion has a first selected length and a second end portion coupled to the second end of the armature wherein the second end portion has a second selected length. The electric linear displacement motor also includes a first bearing assembly attached to the first end of the stator housing. The first bearing assembly comprises a first bearing housing configured to be attached to the first end of the stator housing and a first bearing positioned within the first bearing housing. The first end portion engages and is carried by the first bearing and wherein the armature does not contact the first bearing. The electric linear displacement motor also includes a second bearing assembly attached to the second end of the stator housing. The second bearing assembly comprises a second bearing housing configured to be attached to the second end of the stator housing and a second bearing positioned within the second bearing housing. The second end portion engages and is carried by the second bearing and wherein the armature does not contact the second bearing.

DETAILED DESCRIPTION OF ILLUSTRATIVE EMBODIMENTS

Figure 1:
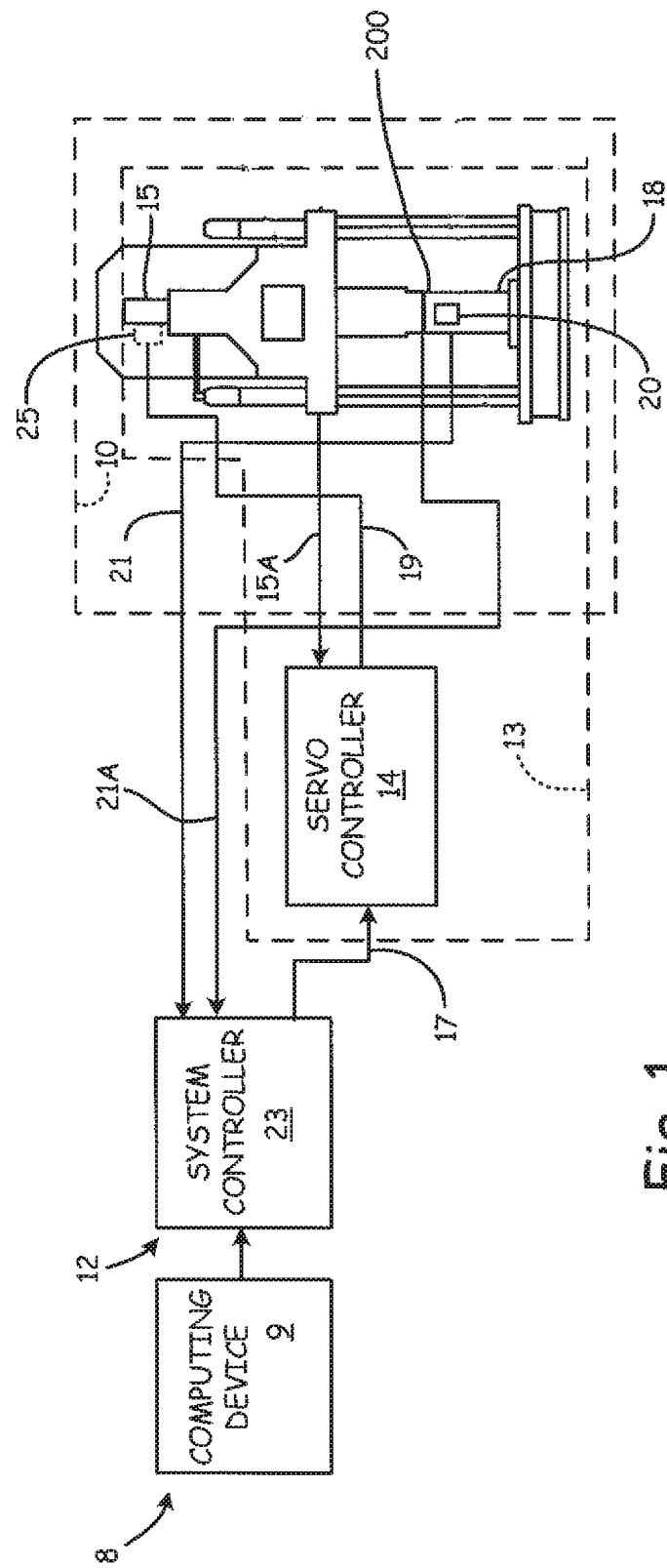
FIG. 1 is a schematic illustration of a test assembly and control loop.

FIG. 1 illustrates a testing machine system 8 comprising a computing device 9 for generating a GUI and/or control a test machine 12. A test machine 12 includes a plant or physical system 10. In the exemplary embodiment, the physical system 10 generally includes a controllable element such as an actuator system, motor or the like.

As illustrated in FIG. 1, the actuator system 13 includes a controller 14 and an actuator 15 (hydraulic, pneumatic and/or electric). In the schematic illustration of FIG. 1, the actuator 15 represents one or more actuators that are coupled through a suitable mechanical interface 16 to a test specimen 18.

The controller 14 provides an actuator command signal 19 to a controlled device 25 (e.g. servo valve, power controller, or electric linear displacement motor) to operate the actuator 15, which in turn, excites the test specimen 18. It should be noted the controller 14 is of a design suitable for controlling the type of actuator employed. Suitable feedback 15A can be provided from the actuator 15 to the controller 14 or from other sensors. One or more remote transducers 20 on the test specimen 18 or physical system 10, such as displacement sensors, strain gauges, accelerometers, load cells, thermometers or the like, provide a measured or actual response 21. In the exemplary embodiment, a load cell 200 provides a response 21A. A system controller 23 receives an actual response 21 as feedback in a response to a signal 17 as input to the servo controller 14.

In the illustration of FIG. 1, signal 17 is a reference signal, signal 19 is a manipulated variable (command to actuated device) and signal 15A is a feedback variable. Although illustrated in FIG. 1 for the single channel case, multiple channel embodiments with signal 15A comprising N feedback components and the signal 19 comprising M manipulated variable components are typical and considered another embodiment of the present disclosure.

The test specimen 18 can take any number of forms such as but not limited to material samples, substructures or components. Typically, types of loads that can be applied or imparted to the test specimen 18 include tension, compression and/or torsion in one or more degrees of freedom applied separately or at the same time. The test specimen 18 can also or alternatively be subjected to controlled displacements in one or more degrees of freedom applied separately or at the same time.

Figure 2:
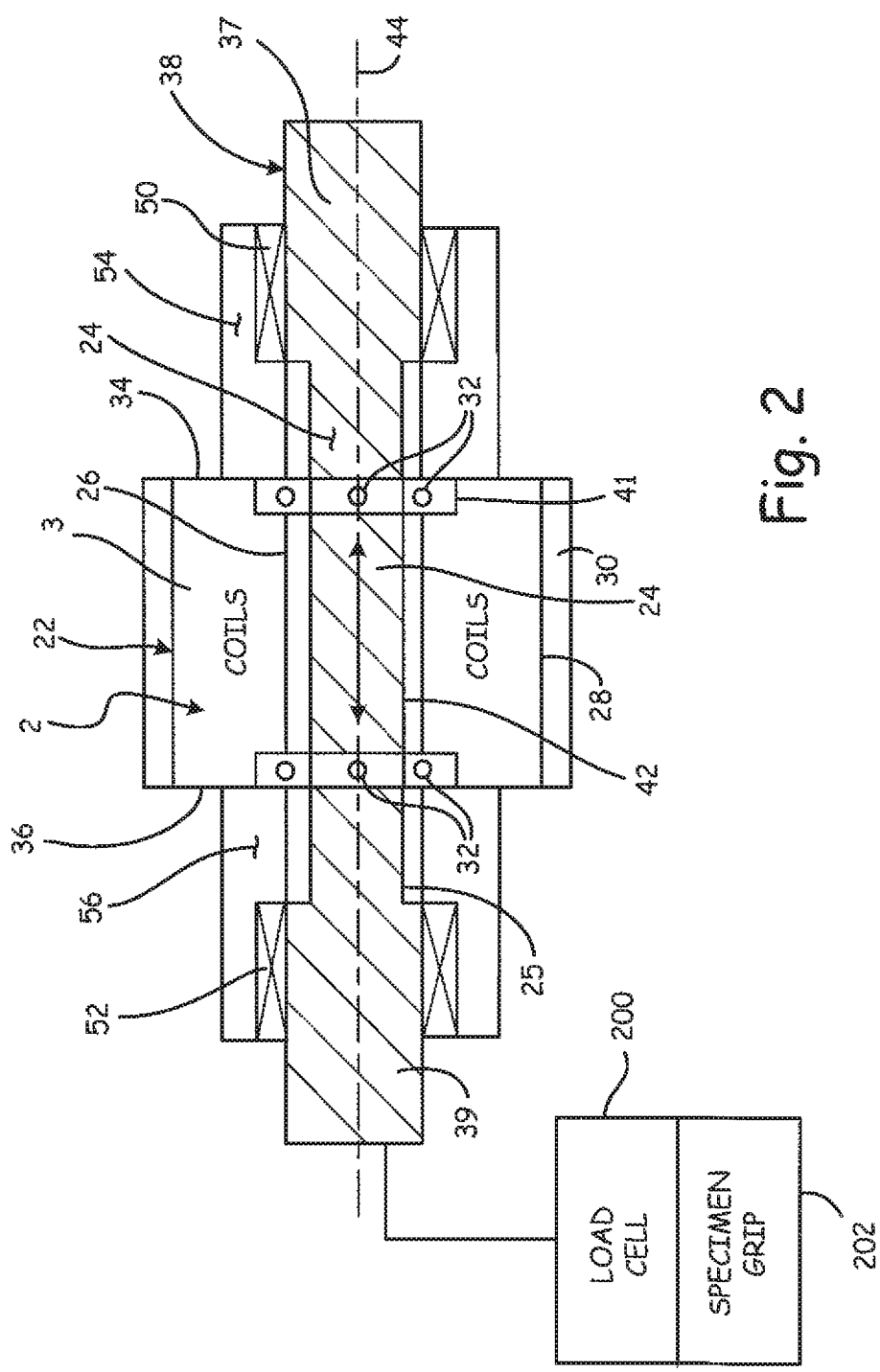
FIG. 2 is a schematic cross-sectional illustration of an electric linear motor including a linearly movable armature rod.

FIG. 2 illustrates a cross-sectional view of an electric linear displacement motor 2 that is utilized to impart an impulse to the test specimen. The electric linear displacement motor 2 includes a stator 22 and an armature 24 that is controllably movable relative to the stator 22. The stator 22 includes a plurality of coils 3 that can be energized to provide a desired magnetic field pattern along a length of an inner channel 26 of a stator housing 28.

When the coils 3 are energized, a significant amount of heat can be generated. To dissipate the heat generated by the energized coils, a plurality of fins 30 may optionally be utilized to increase the surface area of the stator housing 28. The plurality of fins 30 extend about an outer circumference of a stator housing 28 and dissipate heat generated when the coils 3 are energized.

The stator housing 28 includes a plurality of threaded set screw openings 32 that are located at first and second ends 34 and 36, respectively. The plurality of threaded set screw bores 32 are typically uniformly spaced apart about an outer circumference of the stator housing 28 at the first and second ends 34 and 36, respectively. The plurality of set screw openings 32 are used during the assembly of the armature 24 within the stator housing 28. The plurality of set screw bores 32 should include at least three uniformly spaced apart set screw openings 32 at the first and second ends 34 and 36, respectively, of the stator housing 28.

In an exemplary embodiment, the armature 24 has a cylindrical rod configuration. The armature 24 includes a pattern of magnets that are spaced about a circumference 25 of the armature 24 and spaced along a length of the armature 24. It should be noted that although illustrated embodiments show a cylindrical or rod shaped armature 24 and/or end portions 37 and 39. The present disclosure is not limited to cylindrically shaped armatures or rods, and square, rectangular or other shaped armatures can be used depending upon the motor design The armature 24 extends through a central bore 41 of the stator housing 28 such that the stator coils 3 are concentric with the magnets on the armature 24. When assembled, a small annular gap 42 is formed between the magnets on the armature 24 and the stator coils 3. The annular gap 42 allows the magnets in the armature 24 to interact with the electric field created by the energized coils 3 to linearly move the armature 24, and therefore, impart an impulse to the specimen 18 through a load cell 200 and a specimen grip 202.

As illustrated in FIG. 2, an armature assembly 38 is schematically illustrated where a first end portion 37 is attached to a first end of the armature 24 and a second end portion 39 is attached to a second end of the armature. The first end portion 37 extends beyond a first end 34 of the stator housing 28 and the second end portion 39 extends beyond the second end 36 of the stator housing 28.

The first and second end portions 37 and 39 extend beyond the magnetic field created by the electric field generated by the coils 3 located in the stator housing 28 and the magnets secured to the armature 24. The first and second end portions 37 and 39 therefore can be constructed from magnetic material or a nonmagnetic material that is harder than the material of construction of the armature 24 that is positioned within the stator housing 28.

The first and second end portions 37 and 39 engage first and second bearings 50 and 52 proximate the first and second ends 34 and 36, respectively. The engagement of the first and second end portions 37 and 39 with the first and second bearings 50 and 52, respectively, allow for linear movement of the armature 24 along a longitudinal axis 44 relative to the stator housing 28. The bearings 50 and 52 are enclosed in bearing housings 54 and 56 that are connected to the first and second ends 34 and 36, all respectively, of the stator housing 28.

It is contemplated that the bearings 50 and 52 are steel linear roller bearings having steel rolling elements that support the armature assembly 38 for linear movement. However, other types and materials of construction of the bearing are also contemplated.

Since the bearing housings 54 and 56 are attached to the ends 34 and 36 of the stator housing 28, the bearing housings 54 and 56 and the bearings 50 and 52 are located outside or beyond the magnetic field generated via interaction between the magnets on the armature 24 and the electric field generated by the energized coils 3 in the stator housing 28. If the bearing housings 54 and 56 and the bearings 52 and 54 were located within the magnetic field, the magnetic field could adversely affect the performance or responsiveness of the electric displacement motor 2.

Because the first and second end portions 37 and 39 can be of a hard metallic material such as aluminum and possibly made of a magnetic material, such as steel, the end portions 37 and 39 are able to engage the bearings 50 and 52, respectively, inhibiting wear or erosion. In contrast, the armature 24 and the magnets attached to the armature 24 are of a softer material of construction and therefore may be susceptible to erosion or wear if engagement exists with the bearings 50 and 52. Therefore, it is beneficial to have the bearings 50 and 52 engage the end portions 37 and 39 and not the armature 24.

Installing the armature 24 within the stator housing 28 can be difficult and complex due to the interaction of the magnets on the armature 24 with the magnetic components of the stator 22. The magnets on the armature 24 tend to pull toward the magnetic materials, and causes the armature 24 to be misaligned relative to the coils 3 or gouge the surface of the armature 24 as the armature 24 is installed, which will adversely affect the performance of the electric linear displacement motor 2.

Figure 3:
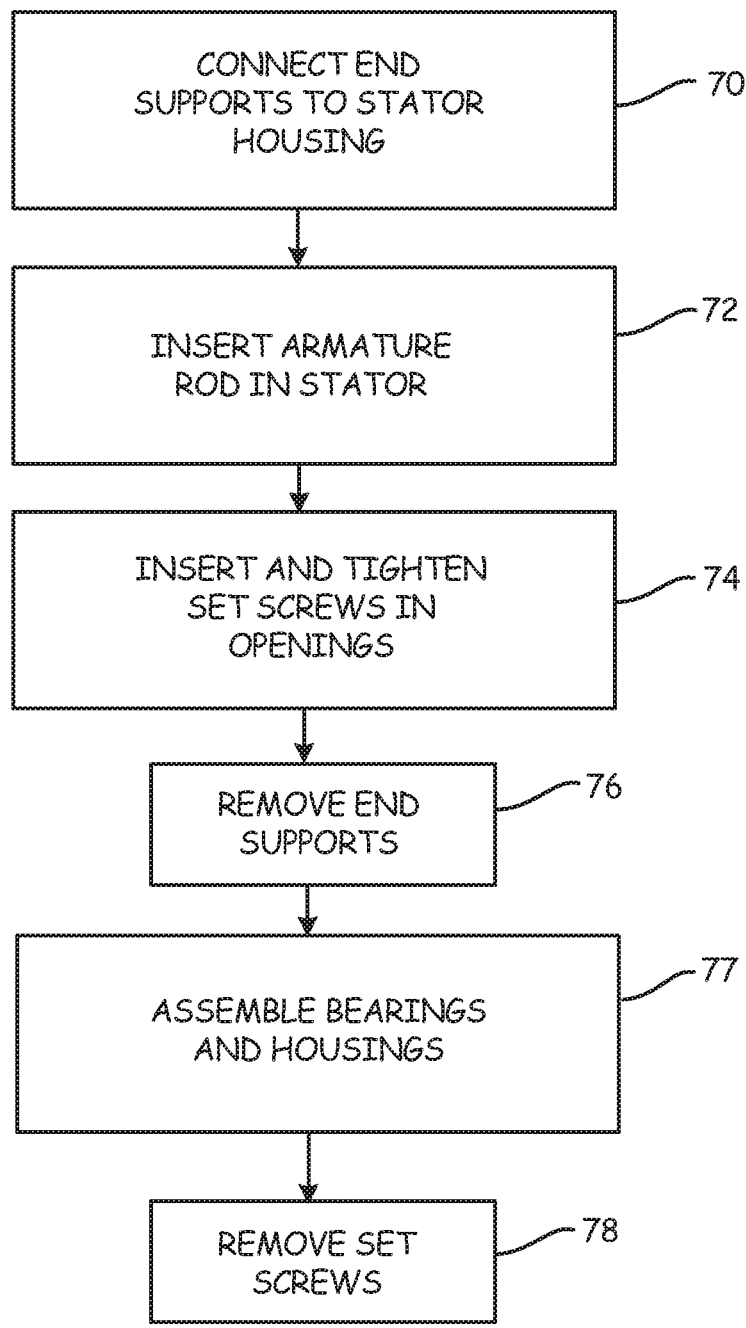
FIG. 3 is a flow chart illustrating assembly steps for assembling the electric linear motor.
Figure 4:
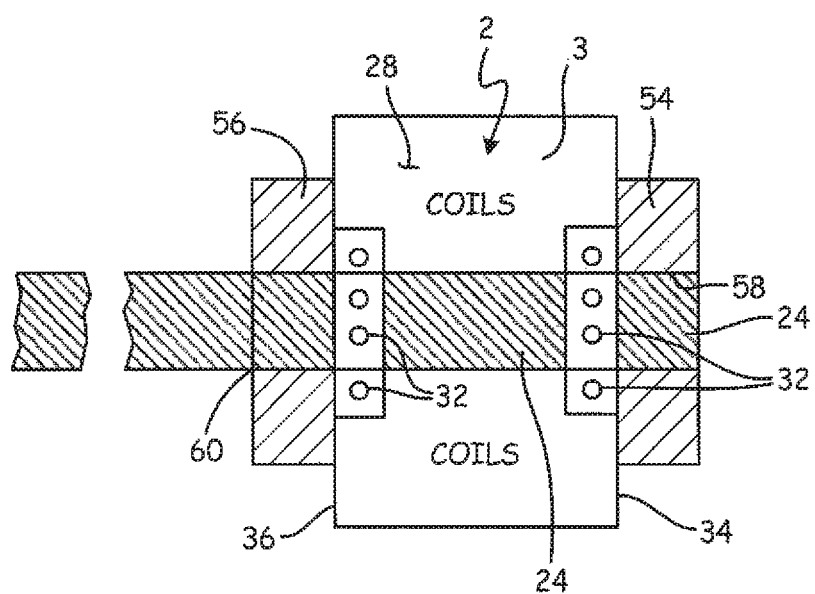
FIG. 4 schematically illustrates end supports for assembly of the armature shown in FIG. 2.
Figure 5:
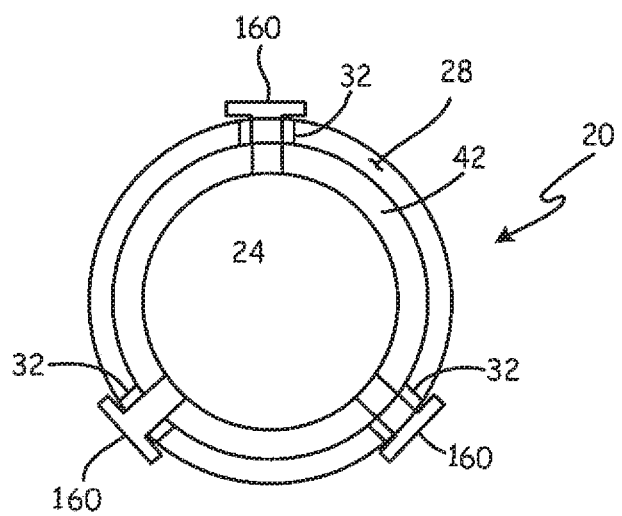
FIG. 5 schematically illustrates openings in the stator and set screws to maintain a position of the armature for assembly.

FIGS. 3-5 disclose a method and devices that are utilized to install and accurately position the armature 24 in stator housing 28 irrespective of the interaction of the magnets of the armature 24 with the magnetic components within the stator housing 28. Prior to installing the armature assembly 38, first and second end supports 54 and 56 are attached to the first and second ends 34 and 36 of the stator housing 28 in step 70 illustrated in FIG. 3. The first and second supports 54 and 56 include through bores 58 and 60, respectively, that receive the armature 24 and align the armature 24 within the stator housing 28. Either through bore 58 or 60 in the first or second end support 54 or 56 retains the armature 24 in a selected spatial relationship within the coils 3 and prevents the magnets on the armature 24 and the magnet materials in the stator housing 28 from contacting each other.

The armature 24 is inserted through the stator housing 28 until the ends of the armature 24 are positioned within and supported by the end supports 54 and 56. With the armature 24 installed within the stator housing 28, the armature 24 is supported by both the first and second end supports 54 and 56, at step 72 in FIG. 3.

With the ends of the armature 24 supported by the end supports 54 and 56, set screws 160 threadably engage the threaded set screw bores 32 to engage the armature 38. The set screws 160 are manipulated to engage the armature assembly 38 to position the armature assembly 38 as disclosed, relative, preferably concentrically, to the stator housing 28 and the coils 3 as shown in step 74 in FIG. 3.

Referring to FIG. 5, the stator housing 28 typically includes at least three uniformly spaced threaded set screw bores 32 that threadably engage the threaded set screws 160. However, three or more threaded set screw bores 32 and associated set screws 160 at each of the stator housing 28 are also contemplated to center the armature 24 within the stator housing 28.

In step 76, the end supports 54 and 56 are removed as the set screws 60 are retaining the armature 24 in the selected concentric location within the stator housing 28. Provided the materials of construction of the bearings 50 and 52 and the armature 24 can withstand the linear movement of the armature 24 within the bearings 50 and 52 without causing erosion, it is optional to have the armature 24 riding on the bearings 50 and 52. In this configuration, the bearing housings 54 and 56 are attached to the ends of the stator housing 28 and the bearings 50 and 52 are positioned the bearing housings 54 and 56, respectively, such that the bearings 50 and 52 carry the armature 24 as provided in step 77 of FIG. 3.

Because the bearings 50 and 52 are supporting the armature 24, the set screws 60 are not necessary and are removed in step 78 of FIG. 3. With the set screws 60 removed from the stator housing 28, the armature 24 is only supported by the bearings 50 and 52, and therefore can react to the interaction between the magnets on the armature 24 and the electric field caused by the energized coils 3.

Figure 6:
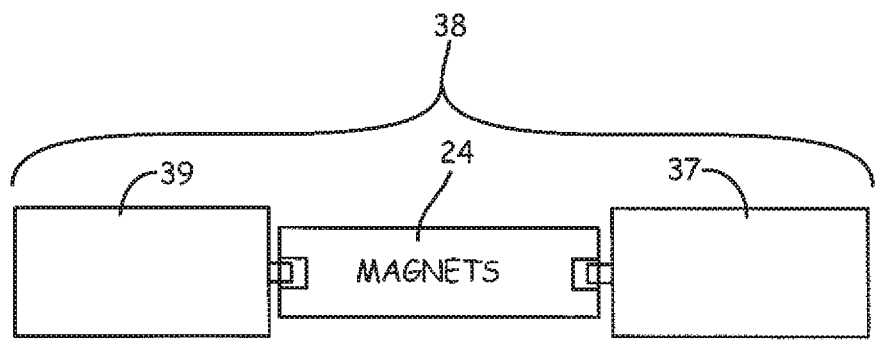
FIG. 6 schematically illustrates an armature formed of separate components, which are connected to form the armature.
Figure 7:
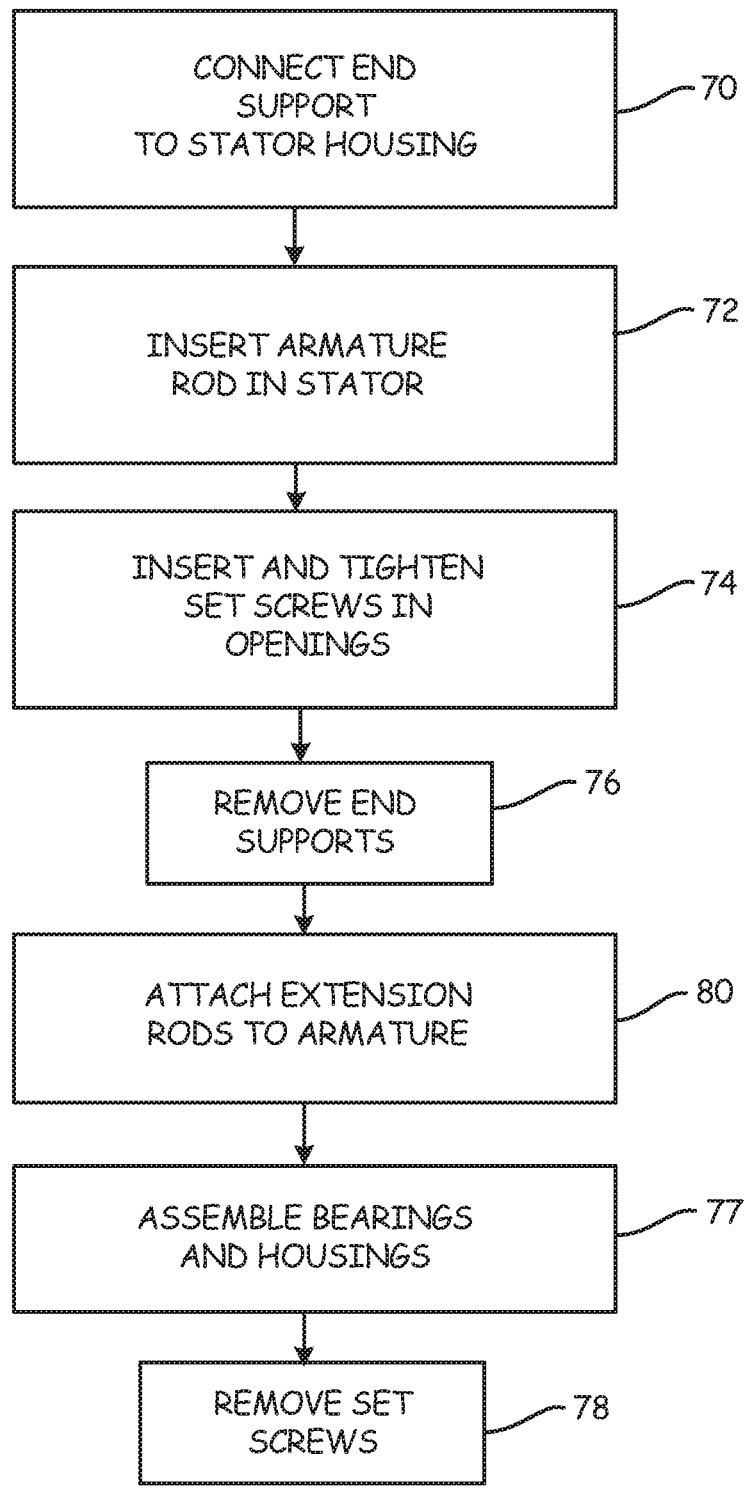
FIG. 7 is a flow chart illustrating assembly steps for assembling the armature illustrated in FIG. 6.

Referring to FIGS. 6 and 7, the armature assembly 38 is schematically illustrated along with a method of installing the armature assembly 38 within the stator housing 28. The method utilizes the end supports 54 and 56 as illustrated in FIG. 4.

FIG. 6 illustrates a the armature assembly 38 with first end and second end portions 37 and 39, formed of separate components, which are connected to the ends of the armature 24 carrying the magnets to form the armature assembly 38. The end portions 37 and 39 are connected by fastening mechanisms to the armature 24. A typical fastening mechanism is a threaded engagement. However, the end portions 37 and 39 can be connected to the armature 24 through any suitable means.

The armature assembly 38 with the end portions 37 and 39 attached extends the length of the armature 24 and provides additional flexibility regarding how the electric linear displacement motor 2 is utilized. The end portions 37 and 39 can be of different material compositions or dimensions than the armature 24. For example in the embodiment shown, the end portions 37 and 39 have a larger outer diameter than armature 24. The dimension of the end portions 37 and 39 can be sized differently depending upon the bearing dimensions and size. As indicated above, the end portions 37 and 39 and armature 24 can be formed of different materials depending upon the particular application. For example, the armature 24 can be formed of a rigid material having suitable magnetic properties while the end portions 37 and 39 can be formed of steel or other rigid materials specifically designed or coated to interface with the bearings 50 and 52 to support the armature 24 for axial movement.

FIG. 7 illustrates assembly steps for a motor assembly including separate armature components. The steps shown in FIG. 7 are the same as FIG. 3 except that prior to assembly of the bearings 50 and 52 within the bearing housings 54 and 56, the end portions 37 and 39 are connected to the armature assembly 38 in step 80. U.S. Provisional Application Ser. No. 61/649,774 filed on May 21, 2012 is incorporated by reference herein in its entirety.

The present disclosure of the electric linear displacement motor 2 is disclosed in the context of a specimen testing device. However the aspects herein described can be utilized in other applications, including, but not limited to, testing devices that require a linear actuator.

As illustrated, the armature 24 is typically controlled within the stator 22 when the coils 3 within the stator housing 28 are energized. However, if power is discontinued to the testing device during use, the armature 24 may freely fall due to the fact that there is no electric field generated by the coils 3, and gravity would cause the armature 24 to fall.

Figure 8:
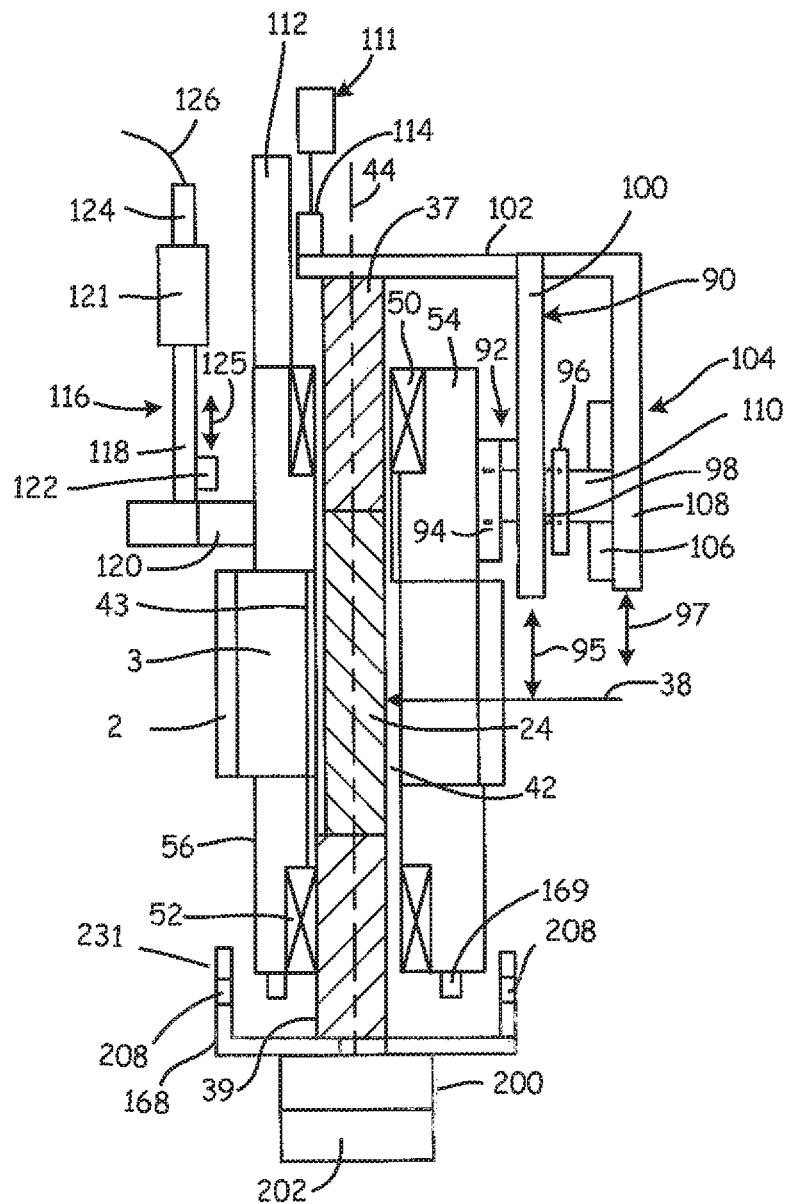
FIG. 8 is a schematic view of the test assembly with a brake, anti rotation device and a position sensor.

Referring to FIG. 8, to prevent uncontrolled movement of the armature 24 if power is interrupted, a braking assembly 90 is configured to arrest or stop movement of the armature assembly 38 in the event of power loss. The braking assembly 90 includes a caliper assembly 92 having spaced apart plates 94 and 96 that have a gap 98 therebetween when power is supplied to the device. The caliper assembly 92 is secured to the bearing housing 54 to retain the caliper assembly 92 in a fixed selected position.

A brake band 100 (e.g., metal) is coupled to the first end portion 37 with a rigid mounting bracket 102. As illustrated, the mounting bracket 102 attaches proximate a top end of the first end portion 37 and extends substantially horizontally from the first end portion 37. The metal brake band 100 is attached to the mounting bracket 102 such that the metal brake band 100 is substantially vertical and is located substantially parallel to the axis 44 of the armature assembly 38.

As the armature assembly 38 moves along the axis 44, the brake band 100 also moves in a parallel path illustrated by arrows 95. Because the brake band 100 does not contact the caliper plates 94 and 96 while power is supplied to the testing device, the caliper plates provide no resistance to the brake band 100 when power is supplied to the caliper assembly 92.

However, when power is interrupted to the caliper assembly 92, the caliper assembly 92 is biased to cause the plates 94 and 96 to move toward each other. As the plates 94 and 96 move toward each other, the plates 94 and 96 frictionally engage the brake band 100 and therefore prevent further movement of the armature assembly 38 due to the coupling of the brake band 100 to the end portion 37 with the mounting bracket 102. An illustrative braking assembly is a linear braking assembly manufactured by Ortlinghaus of the United Kingdom.

The armature assembly 38 can rotate within the stator 22 without additional equipment. Since the armature assembly 38 is coupled to the specimen holder 119, the undesired rotation of the armature assembly 38 can cause testing results to be skewed.

In order to prevent the undesired rotation of the armature assembly 38, an anti-rotation device 104 is provided to limit rotation or off-axis movement of the armature assembly 38. The anti-rotation device 104 includes a rail 106 coupled to a plate 108 that is coupled to the mounting bracket 102. A linear bearing 110 is coupled to the bearing housing 54 such that the linear bearing 110 is stationary.

As the plate 108 and the rail 106 are coupled to the mounting bracket 102 which is attached to the first portion 37 of the armature assembly 38, as the armature assembly 38 moves along the axis 44, the rail 106 moves in a parallel path indicated by arrows 97 to the axis 44 and within the linear bearing 110. The interaction of the moving rail 106 within the linear bearing 110 prevents rotation of the armature assembly 38.

An incremental encoder 111 can be coupled to the end portion 37 of the armature assembly 38 to provide an incremental position of the armature assembly 38. The encoder 111 includes an encoder scale 112 fixed to the second bearing housing 56 and an encoder head 114 coupled to the mounting bracket 102 and moveable therewith to provide displacement output for the armature assembly 38.

The test machine 12 includes a linear variable displacement transducer (LVDT) assembly 116. In one embodiment, the LVDT assembly 116 comprises a waveguide 118 and a pulse detector 121 mounted to the second bearing housing 56 through block 120. A floating magnet 122 coupled to the mounting bracket 102 and mounted, for example, on the vertical plate 108 and moveable as illustrated by arrows 125 therewith provides position input for motor start up and an analog velocity for input to safety circuitry (not shown). The details of operation of the LVDT illustrated are not pertinent but generally the position output is provided via the interaction of the floating magnet 122 with respect to the magnetic field generated along the waveguide 118. An electrical interface 126 is provided to the transducer assembly 116 through connector 124.

Advantageously, the armature assembly 38 herein described carries the mounting bracket 102, the brake band 100, the plate 108 and the rail 106 along with the magnet 122. As such the mass or weight of the components moved along with the armature assembly 38 is significantly reduced as compared to each of the coupled parts. As such the armature 38 is more responsive relative to other devices where the armature carries more weight or mass.

Due to the creation of heat from the coils 3 being energized and the powering of other electric equipment, a cooling assembly 154 to remove heat from a testing head assembly 150 may be required. In the embodiment shown in FIG. 9, the head assembly 150 includes the cooling assembly 154, which is enclosed within a head cover 156. The head assembly 150 includes various electronic components 158 (schematically shown) for operation of the test apparatus. The electronic components 158 and the linear motor assembly 152 including the electric linear displacement motor 2 are also enclosed within the head cover 156. As shown, the cooling assembly 154 is carried on and attachable to a crosshead 151 proximate to the motor assembly 152.

Referring to FIGS. 9-13, the cooling assembly 154 includes a flow divider 170 and a plurality of fans 172 fluidly coupled to a duct assembly 174. The duct assembly 174 is assembled about the motor 152 to form a flow passage 176 shown more clearly in FIG. 13 surrounding and extending along a length of the motor 152.

Figure 10:
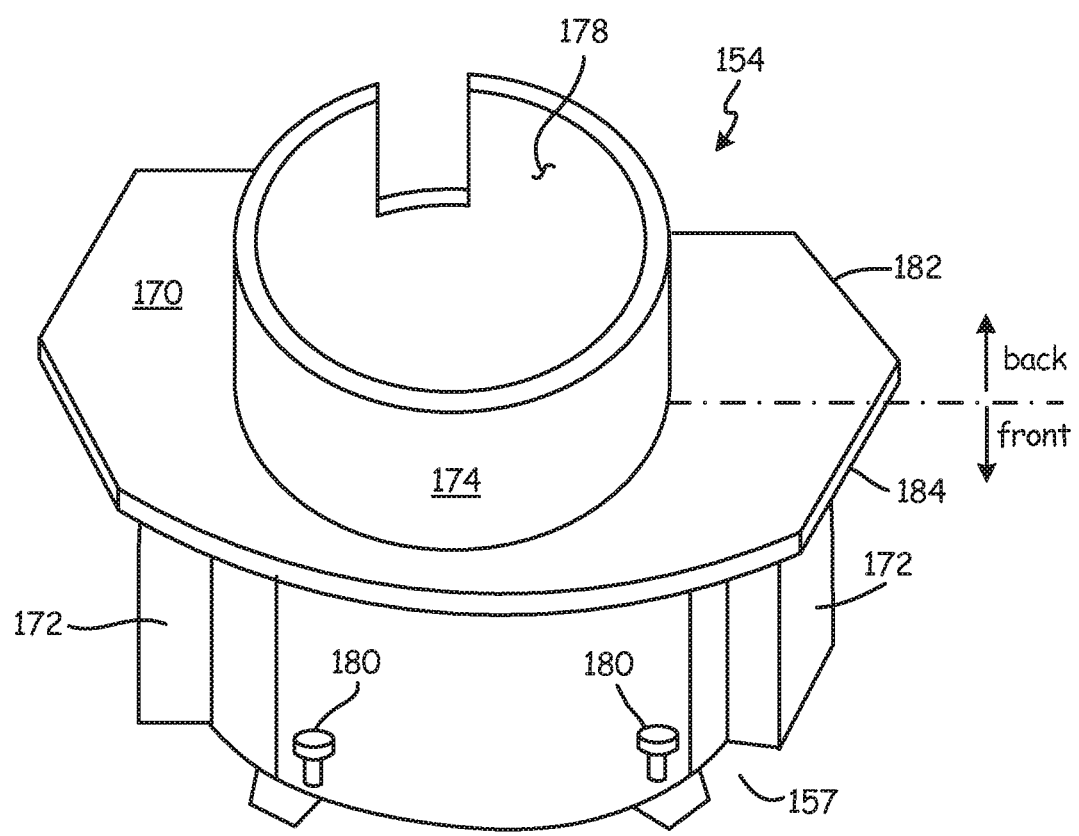
FIG. 10 is a schematic perspective view of a portion of the cooling assembly.

The cooling assembly 154 is connected to the crosshead 151 via fasteners 180 shown in FIG. 10. Flow divider 170 is coupled to and extends about the duct assembly 174 to separate an upper portion 182 of the head 150 from a lower portion 184 of the head 150. The electronic components 158 are contained in the upper portion 182 of the head 150. Heat is generated from the electronic components 158 and the motor 152 of the head assembly 150. Since the electronic components 158 are in the upper portion 182, the upper portion 182 is typically hotter than the lower portion 184 of the head assembly 150. Thus the divider 170 provides a barrier that separates the upper portion 182 from the lower portion 184 so that the warmer air in the upper portion 182 of the head 150 does not mix with the cooler air in the lower portion 184 of the head 150. Therefore, the cooler air is supplied from the lower portion 184 along the motor 152 to cool the motor 152.

Figure 9:
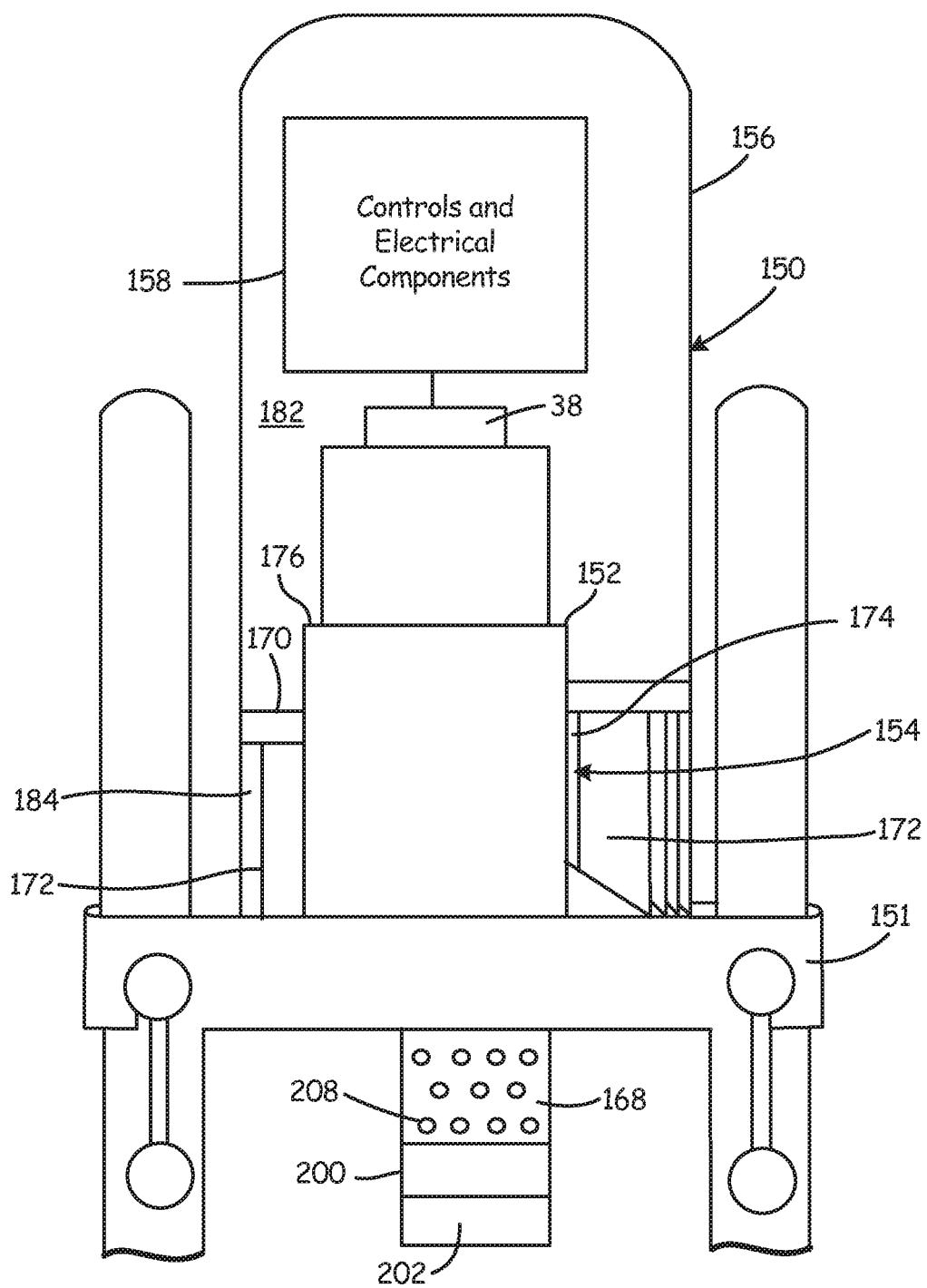
FIG. 9 is a schematic view of a head assembly of testing device including a cooling assembly.
Figure 11:
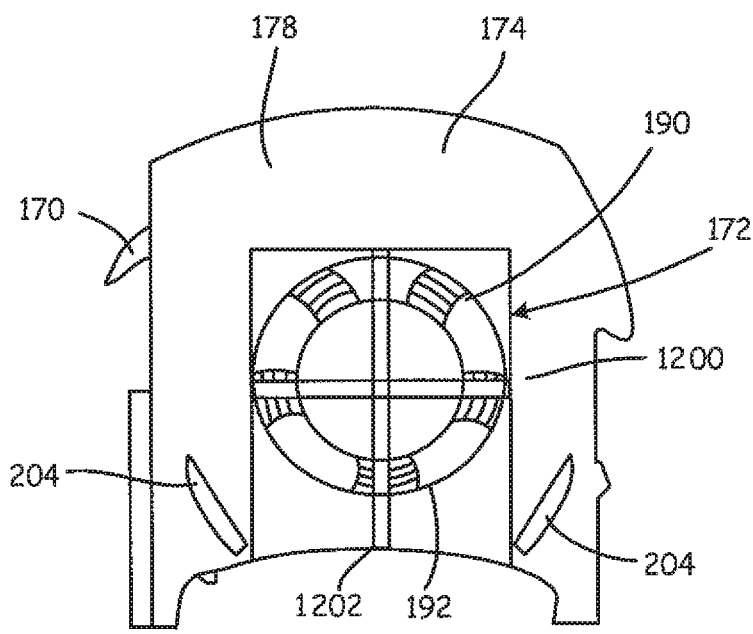
FIG. 11 is another schematic perspective view of another portion the cooling assembly.
Figure 12:
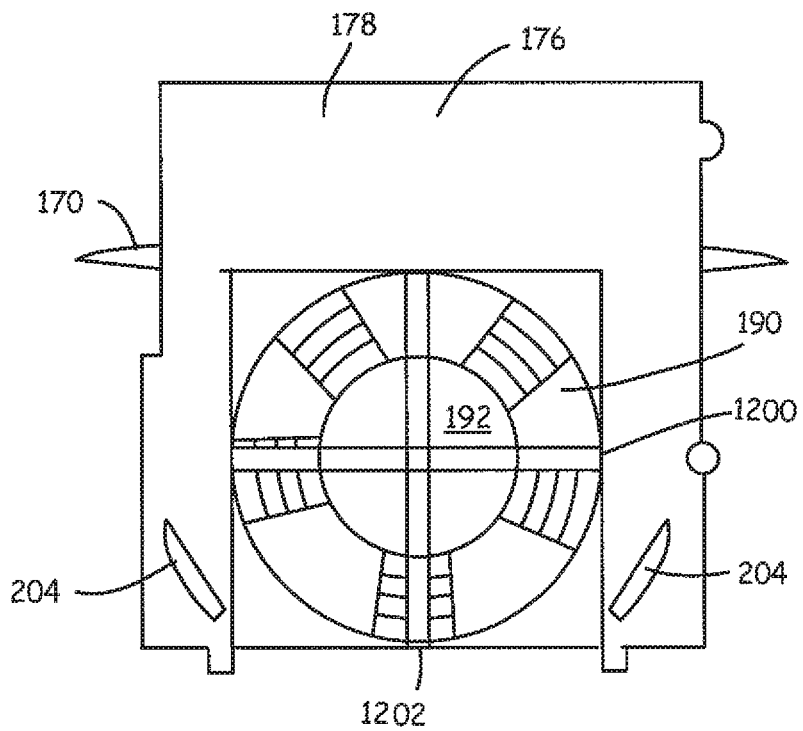
FIG. 12 is another schematic perspective view of another portion the cooling assembly.
Figure 13:
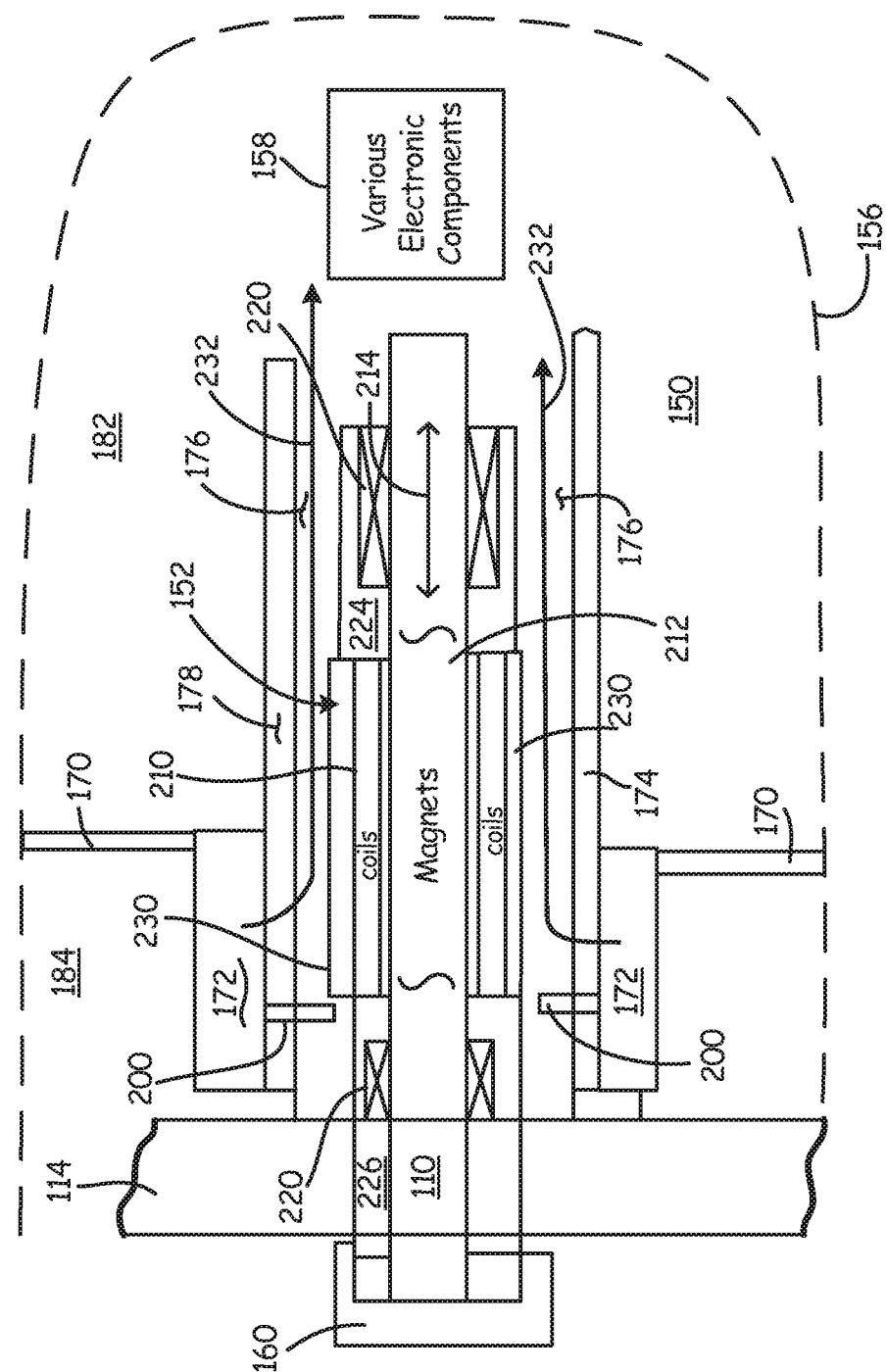
FIG. 13 is a schematic view of the head assembly including the cooling assembly.

Fans 172 are fluidly coupled to the duct assembly 174 as shown in FIG. 10. As shown, the duct assembly 174 includes a flow conduit 178 that is assembled about the motor 152 to form the air flow passage 176 along the motor 152 as shown in FIGS. 9 and 13. As shown in FIGS. 11 and 12, the fans 172 includes blades 190 coupled to a rotating disc 192 that pull air into the duct assembly 174 to generate air flow through conduit 178. As shown the flow conduit 178 includes diverters, barriers, or dividers 1200, 1202 proximate to an inlet from the fans 172 to the flow conduit 178. As shown, air barrier 1200 extends crosswise at an elevation above the bottom of the fan 172 to provide an upper/lower flow barrier and barrier 1202 extends lengthwise to divide flow into front and back flow streams to equalize fluid flow between front and back portion of the head assembly 150. Air vanes 204 are coupled to an inner wall of the flow conduit 178 and are angled to direct air flow toward the upper portion 182 of the head assembly 150.

As schematically shown in FIG. 13, the electric liner motor 152 includes a stator including a plurality of energizeable coils and an armature 212 including a plurality of magnets and operates as discussed above. The motor includes a plurality of fins or heat sinks 230 to remove heat from the motor. Diverter 1200 is supported relative to stator 210 to divert cooler air flow upwardly (as illustrated by arrows 232) along the flow passage 176 and fins 230.

As shown in FIGS. 11 and 12, diverter 1200 is contoured to conform to a round motor stator. Application of embodiments disclosed herein are not limited to any particular shape. For example, the flow conduit can have various shapes depending upon the shape of the motor. Thus in one example, the flow conduit 178 has a generally square shaped cross-section to fit about a generally square shaped motor. Thus as shown, rotation of blades 190 of the fans 172 provides air flow to cool the head assembly 150 as described.

Referring to FIGS. 8 and 9, the load cell 200 and/or specimen grip 202 can be coupled to actuator assembly 38 through or about end cap 168 to supply the load or displacement to a test specimen such as test specimen 18. The vented end cap 168 protects parts of the actuator assembly 38 as it travels along the axis and also inhibits 44 and also inhibits the buildup of dust and debris on the actuator assembly in the event that a layer of grease or oil is on the end portion 39 of the actuator assembly 38 to reduce friction as the end portion 39 travels through the bearing 52. The actuator assembly 38 slides over but does not contact rim 231 of the end cap 168 along an outer surface of the bearing housing 56. Vent openings 208 shown in FIG. 9 dissipate air pressure to reduce application resistance or damping to movement of the actuator assembly 38 and cap 168 along the bearing housing 56. Other configurations of the end cap 168 and vent openings 208 could otherwise be used.

Rubber stoppers 169 may be attached to an end face of bearing housing 56 to provide an upper contact interface between the vented end cap 168 and the bearing housing 56. U.S. Provisional Application Ser. No. 61/649,367 filed on May 20, 2012 is incorporated by reference herein in its entirety.

Although disclosed as being utilized with a testing machine that applies a linear force, aspects of the disclosure are equally applicable to a testing machine comprising a rotory actuator assembly or in the alternative with an actuator assembly that applies force and torque.

Although the present invention has been described with reference to preferred embodiments, workers skilled in the art will recognize that changes may be made in form and detail without departing from the spirit and scope of the invention. In particular the actuator or motor assembly described herein is not limited to use for a material testing apparatus and the assembly can be used for other linear actuator applications as appreciated by those skilled in the art.

What is claimed is:

1. A method of constructing an electric linear displacement motor for use in a testing device, the method comprising:
   providing a stator having a stator housing with internal coils and a through bore extending from a first end of the stator housing to a second end of the stator housing;
   connecting a first end support to the first end of the stator housing and a second end support to the second end of the stator housing wherein the first and second end supports each have aligned through bores that align with the through bore in the stator housing;
   inserting an armature having magnets retained therein between a first armature end to a second armature end through the through bore in the first end support and into the stator housing until the first armature end is supported by the first end support and the second armature end is supported by the second end support such that an annular gap separates the armature and the coils; and
   inserting a plurality of set screws into threaded openings proximate both the first end and the second end of the stator housing such that the set screws retain the armature and the first and second end supports provide no support to the armature.

2. The method of claim 1 and further comprising:
   removing the first end support from the first end of the stator housing; and
   removing the second end support from the second end of the stator housing.

3. The method of claim 2 and further comprising:
   attaching a first bearing housing to the first end of the stator housing; and
   attaching a second bearing housing to the second end of the stator housing.

4. The method of claim 3 and further comprising:
   positioning a first bearing in the first bearing housing such that the first bearing engages and carries one end of the armature; and
   positioning a second bearing in the second bearing housing such that the second bearing engages and carries another end of the armature.

5. The method of claim 4 and further comprising removing the plurality of set screws from proximate the first and second ends of the stator housing such that the armature freely moves within the stator housing.

6. The method of claim 5 and further comprising:
   attaching a first end portion to the first armature end; and
   attaching a second end portion to the second armature end where the first and second end portions are attached to the armature prior to installing the first and second bearing housings and the first and second bearings.

7. The method of claim 6 and further comprising:
   positioning the first bearing within the first bearing housing such that the first end portion engages and is carried by the first bearing; and positioning the second bearing within the second bearing housing such that the second end portion engages and is carried by the second bearing.

8. The method of claim 6 and wherein the attaching of the first and second end portions to the first armature end and the second armature end is through threadable engagements.

* * * * *